United States Patent
Tam

(10) Patent No.: US 7,663,405 B2
(45) Date of Patent: Feb. 16, 2010

(54) ORGANIC TFT INVERTER ARRANGEMENT

(75) Inventor: Simon Tam, Cambridgeshire (GB)

(73) Assignee: Seiko Epson Corporation, Tokyo (JP)

( * ) Notice: Subject to any disclaimer, the term of this patent is extended or adjusted under 35 U.S.C. 154(b) by 10 days.

(21) Appl. No.: 12/071,367

(22) Filed: Feb. 20, 2008

(65) Prior Publication Data

US 2008/0218200 A1 Sep. 11, 2008

(30) Foreign Application Priority Data

Feb. 20, 2007 (GB) ................................ 0703258.4

(51) Int. Cl.
*H03K 19/094* (2006.01)
(52) U.S. Cl. ............................ 326/83; 326/81; 326/104
(58) Field of Classification Search ............. 326/62–63, 326/68, 80–83, 86, 87; 327/112, 333; 345/55, 345/82–83, 87–104, 204–205
See application file for complete search history.

(56) References Cited

U.S. PATENT DOCUMENTS

| | | | | |
|---|---|---|---|---|
| 2002/0158666 | A1* | 10/2002 | Azami et al. ................... | 326/83 |
| 2005/0189968 | A1* | 9/2005 | Brazis et al. ................. | 327/112 |
| 2007/0273426 | A1* | 11/2007 | Cantatore .................... | 327/379 |
| 2008/0143384 | A1* | 6/2008 | Li et al. ........................ | 326/68 |

OTHER PUBLICATIONS

Wang et al. "Bottom contact ambipolar organic thin film transistor and organic inverter based on C$_{60}$/pentacene heterostructure." *Organic Electronics*, vol. 7, 2006, pp. 457-464,.
Gelinck et al. "Flexible active-matrix displays and shift registers based on solution-processed organic transistors." *Nature Materials*, vol. 3, Feb. 2004, pp. 106-110.
Klauk et al. "Pentacene organic thin-film transistors and ICs." *Solid State Technology*, Mar. 2000, beginning at p. 63.
Krumm et al. "A Polymer Transistor Circuit Using PDHTT." *IEEE Electron Device Letters*, vol. 25, No. 6, Jun. 2004, pp. 399-401.
Klauk et al. "Pentacene organic transistors and ring oscillators on glass and on flexible polymeric substrates." *Applied Physics Letters*, vol. 82, No. 23, Jun. 9, 2003, pp. 4175-4177.

* cited by examiner

*Primary Examiner*—James H. Cho
*Assistant Examiner*—Jany Tran
(74) *Attorney, Agent, or Firm*—Oliff & Berridge, PLC

(57) ABSTRACT

An organic TFT (OTFT) inverter arrangement comprises an inverter stage including a series arrangement of first and second MOS OTFTs (T1, T2) connected between first and second supply terminals (VDD), the first and second OTFTs having first and second gates, respectively. An input terminal ($V_{IN}$) is connected to the first gate, while an output terminal ($V_{OUT}$) is connected to the node interconnecting the first and second OTFTs (T1, T2). A bias-control stage is connected between the first gate and the second gate. The bias-control stage is an inverting stage, such that, when an input voltage on the first gate rises, a voltage on the second gate falls, and vice-versa. The bias-control stage comprises a series arrangement of third and fourth OTFTs (T3, T4) connected between the first and second supply terminals ($V_{DD}$, $V_{SS}$), and a series arrangement of fifth and sixth OTFTs (T11, T12) connected between the first and second supply terminals ($V_{DD}$, $V_{SS}$). The fifth and sixth OTFTs (T11, T12) are controlled by the third and fourth OTFTs (T3, T4) and feed the first and second gates, respectively. The OTFT inverter arrangement may be used as the basis of an OTFT logic-gate arrangement.

9 Claims, 13 Drawing Sheets

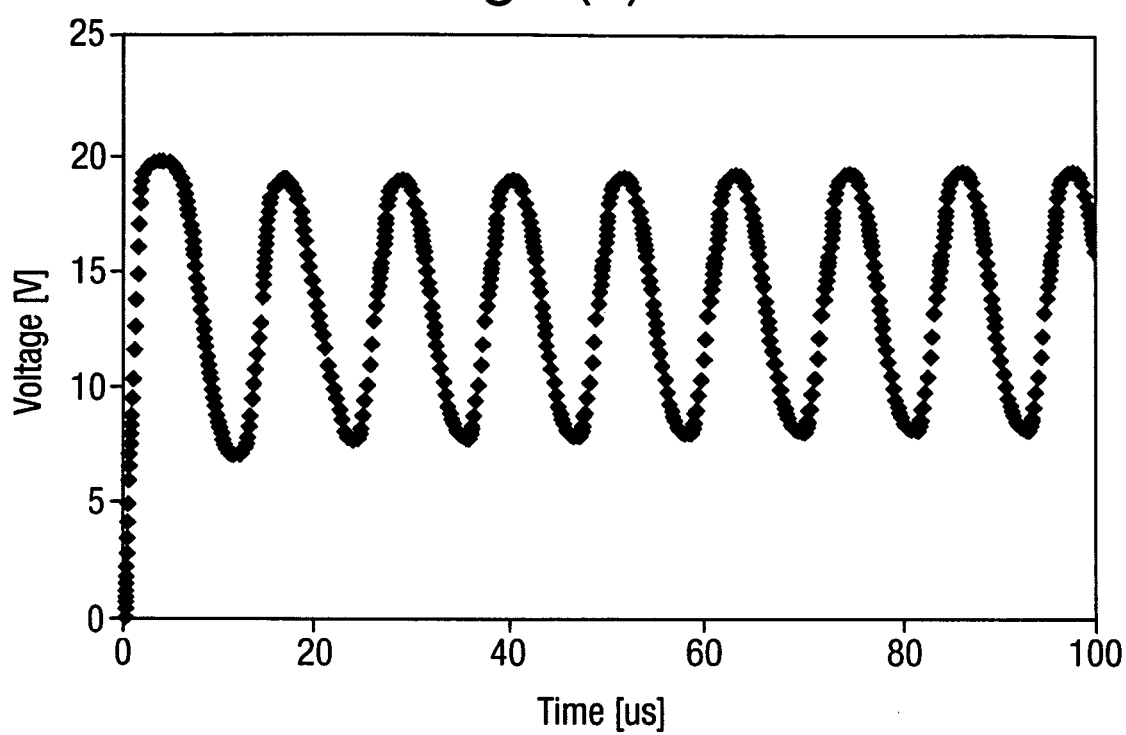

ORGANIC TFT INVERTER ARRANGEMENT

BACKGROUND OF THE INVENTION

1. Field of the Invention

Several aspects of the present invention relate to an organic TFT inverter arrangement and to an organic TFT logic-gate arrangement comprising an organic TFT inverter arrangement.

2. Description of the Related Art

Inkjet organic thin-film transistors (OTFTs) have attracted much attention in recent years, because of the advance in solution-processable materials and inkjet fabrication techniques. Inkjet OTFT technology significantly reduces the cost of fabrication by depositing the material at only the desired places, thereby cutting wastage in material and reducing the process turn-around time. At the same time a significant amount of research effort has been directed to improving the electrical characteristics of OTFTs to a level achieved by amorphous silicon technology, its inorganic counterpart.

The electrical performance of inkjet OTFTs has been limited by, for example, low drain-source current ($I_{DS}$) on/off ratio, poor sub-threshold slope ($\Delta I_{DS}/\Delta V_{GS}$), poor saturation in the output characteristics ($I_{DS}$ VS. $V_{DS}$) and the existence of p-channel devices only, though this latter limitation has more recently been overcome. These limitations do not apply to technologies such as crystalline silicon transistor technology.

Examples of a basic known OTFT inverter arrangement are shown in FIG. 1. FIG. 1(a) gives the general circuit symbol for an inverter arrangement, fed by power supply lines $V_{DD}$ and $V_{SS}$, where $V_{DD} > V_{SS}$, while FIGS. 1(b)-1(d) show more detailed constructions of such an inverter arrangement. FIG. 1(b) shows a p-channel OTFT device driving a purely resistive load and FIGS. 1(c) and (d) show p-channel OTFT devices driving a transistor load. In the case of FIG. 1(c) the load transistor is a diode connected p-channel device (gate connected to drain), while in FIG. 1(d) the load transistor is a p-channel device connected as an active load. The active load accepts a bias voltage at the gate that provides further control to the output voltage.

It is often desirable to optimise the size of the driver and load transistors in such an inverter arrangement, in order to provide a gain greater than unity and a sufficiently wide output swing. The latter is important if a wide noise margin is to be achieved. Unfortunately, the limitations of existing OTFTs make it difficult to meet these criteria. As a result, many researchers have proposed additional stages, such as a level-shifter in order to boost the gain before or after a conventional OTFT inverter stage. Example of this solution will now be described with reference to FIGS. 2 and 3.

In FIG. 2 a level-shifter is included before the inverter-stage. FIG. 2(a) is, again, the general circuit symbol for this arrangement, while FIGS. 2(b) and (c) are detailed embodiments of this arrangement. FIG. 2(b) is an arrangement published by H. Gerwin, et al., in their paper "Flexible active matrix displays and shift registers based on solution-processed organic transistors" in Nature Materials, published in 2004. The first stage acts as a voltage divider through the use of series-connected p-channel OTFTs working in their saturation region. The second stage is the inverter that uses a diode-connected OTFT load. The FIG. 2(c) example works in a similar fashion, but is based around an active OTFT load in the inverter stage. FIG. 2(c) is taken from H. Klauk, et al, "Pentacene organic thin-film transistors and ICs", Solid Stage Technology, Vol. 43, Part 3, pp 63-67, (2000).

In FIG. 3 the level-shifter is added after the inverter stage. The FIG. 3(b) example is published in J. Krumm, et al, "A polymer transistor circuit using PDHTT", IEEE Electron Device Letters, Vol. 25, No. 6 (June 2004). The level-shifter stage works as a voltage follower that fed from the output of the inverter stage. In FIG. 3(c), which is taken from H. Klauk, et al, "Pentacene organic transistors and ring oscillators on glass on flexible polymeric substrates", Applied Physics Letters, Vol. 82, No. 23, pp 4175-4177 (2003), a similar voltage-follower level-shifter stage is employed, but in this case it is driven from the output of an active OTFT load in the inverter stage, instead of from a diode-connected OTFT load, which is the case in the FIG. 3(b) example. In addition the gate of the bias transistor in the level-shifter stage is fed from a different voltage supply from that of the inverter stage.

In both of these examples, the level-shifter stage ensures that high-level voltages can appear on the overall output terminal ("OUT") by providing a voltage rail $V_{LS}$ for the level-shifter stage, which is higher than the inverter voltage rail $V_{DD}$ used for the inverter stage.

SUMMARY OF THE INVENTION

In accordance with a first aspect of the present invention there is provided an organic TFT inverter arrangement comprising an inverter stage comprising a series arrangement of first and second MOS organic TFTs connected between first and second supply terminals, the first and second MOS organic TFTs having first and second gates, respectively; an input terminal connected to the first gate; an output terminal connected to the node interconnecting the first and second MOS organic TFTs, and a bias-control stage connected between the first gate and the second gate, the bias-control stage being an inverting stage, such that, when an input voltage on the first gate rises, a voltage on the second gate falls, and vice-versa; the bias-control stage comprising a series arrangement of third and fourth MOS organic TFTs connected between third and fourth supply terminals, and a series arrangement of fifth and sixth MOS organic TFTs connected between the third and fourth supply terminals, the fifth and sixth MOS organic TFTs being controlled by the third and fourth MOS organic TFTs and feeding the first and second gates, respectively.

In a specific embodiment of this arrangement, the third, fourth, fifth and sixth MOS organic TFTs have third, fourth, fifth and sixth gates, respectively; the third gate and the fifth gate are connected to each other and to the first gate; a node interconnecting the third and fourth MOS organic TFTs is connected to the sixth gate, and a node interconnecting the fifth and sixth MOS organic TFTs is connected to the second gate.

The fourth MOS organic TFT may be configured either as a diode-connected load or as an active load for the third MOS organic TFT.

The bias-control stage may comprise at least one further series arrangement of MOS organic TFTs connected between the third and fourth supply terminals, the at least one further series arrangement being disposed, referred to the signal flow, between the series arrangement comprising the fifth and sixth MOS organic TFTs and the inverter stage.

The first and third MOS organic TFTs may be connected to the first and third supply terminals, respectively, and the second and fourth MOS organic TFTs may be connected to the second and fourth supply terminals, respectively; the input terminal may be connected to the first and third gates and to the gates of those TFTs of the further series arrangements, which are connected to the third supply terminal; the gates of those TFTs of the further series arrangements, which are connected to the fourth supply terminal, may be connected to the respective nodes of the preceding series arrangements, which interconnect the MOS organic TFTs of those series arrangements, and the node interconnecting the MOS organic TFTs of the further series arrangement nearest the inverter stage may be connected to the second gate.

In a second aspect of the present invention, an organic TFT inverter arrangement is provided, comprising: an inverter stage comprising a series arrangement of first and second MOS organic TFTs connected between first and second supply terminals, the first and second MOS organic TFTs having first and second gates, respectively; an input terminal connected to the first gate; an output terminal connected to the node interconnecting the first and second MOS organic TFTs, and a bias-control stage connected between the first gate and the second gate, the bias-control stage being an inverting stage, such that, when an input voltage on the first gate rises, a voltage on the second gate falls, and vice-versa; the bias-control stage comprising: a series arrangement of third and fourth MOS organic TFTs connected between the first and second supply terminals, and a series arrangement of fifth and sixth MOS organic TFTs connected between a third supply terminal and said second supply terminal; the first gate being connected to the gate of the sixth MOS organic TFT; the second gate being connected to a node interconnecting the third and fourth MOS organic TFTs; the gate of the third MOS organic TFT being connected to a node interconnecting the fifth and sixth MOS organic TFTs, and a gate of the fifth MOS organic TFT being supplied with a bias voltage.

The fourth MOS organic TFT may be configured either as a diode-connected load or as an active load for the third MOS organic TFT.

Constituting a third aspect of the invention is an organic TFT inverter arrangement comprising: an inverter stage comprising a series arrangement of first and second MOS organic TFTs connected between first and second supply terminals, the first and second MOS organic TFTs having first and second gates, respectively; an input terminal connected to the first gate; an output terminal connected to the node interconnecting the first and second MOS organic TFTs, and a bias-control stage connected between the first gate and the second gate, the bias-control stage being an inverting stage, such that, when an input voltage on the first gate rises, a voltage on the second gate falls, and vice-versa; wherein the bias-control stage comprises a series arrangement of third and fourth MOS organic TFTs connected between third and fourth supply terminals, the gate of the third MOS organic TFT being connected to the first gate and the second gate being connected to a node interconnecting the third and fourth MOS organic TFTs; and wherein the fourth MOS organic TFT is configured as a diode load for the third MOS organic TFT.

The MOS organic TFTs may be all of the same polarity.

The first supply terminal may be the same as the third supply terminal and/or the second supply terminal may be the same as the fourth supply terminal.

In a fourth aspect of the present invention, an organic TFT logic-gate arrangement is provided, comprising an organic TFT inverter arrangement, the organic TFT inverter arrangement comprising: an inverter stage comprising a series arrangement of first and second MOS organic TFTs connected between first and second supply terminals, the first and second MOS organic TFTs having first and second gates, respectively; an input terminal connected to the first gate; an output terminal connected to the node interconnecting the first and second MOS organic TFTs, and a bias-control stage connected between the first gate and the second gate, the bias-control stage being an inverting stage, such that, when an input voltage on the first gate rises, a voltage on the second gate falls, and vice-versa.

The logic-gate arrangement may be a NAND-gate arrangement, in which: the first MOS organic TFT comprises a pair of parallel-connected TFTs, and the second MOS organic TFT comprises a pair of series-connected TFTs; the bias-control stage comprises a series arrangement of third and fourth MOS organic TFTs connected between the first and second supply terminals, and a series arrangement of fifth and sixth MOS organic TFTs connected between the first and second supply terminals, the third and fifth MOS organic TFTs having respective gates; the gates of the pair of series-connected TFTs being connected respectively to the node interconnecting the third and the fourth MOS organic TFTs and to the node interconnecting the fifth and sixth MOS organic TFTs, and the gates of the pair of parallel-connected TFTs being connected to the respective gates of the third and fifth MOS organic TFTs and to respective input terminals of the logic-gate arrangement.

Alternatively, the logic-gate arrangement may be a NOR-gate arrangement, in which: the first MOS organic TFT comprises a pair of series-connected TFTs, and the second MOS organic TFT comprises a pair of parallel-connected TFTs; the bias-control stage comprises a series arrangement of third and fourth MOS organic TFTs connected between the first and second supply terminals, and a series arrangement of fifth and sixth MOS organic TFTs connected between the first and second supply terminals, the third and fifth MOS organic TFTs having respective gates; the gates of the pair of parallel-connected TFTs being connected respectively to the node interconnecting the third and the fourth MOS organic TFTs and to the node interconnecting the fifth and sixth MOS organic TFTs, and the gates of the pair of series-connected TFTs being connected to the respective gates of the third and fifth MOS organic TFTs and to respective input terminals of the logic-gate arrangement.

The fourth and sixth MOS organic TFTs may be configured either as a diode-connected load or as an active load for the third and fifth MOS organic TFTs.

BRIEF DESCRIPTION OF THE DRAWINGS

Embodiments of the present invention will now be described, by way of example only, with reference to the attached drawings, of which.

Figure 5A:
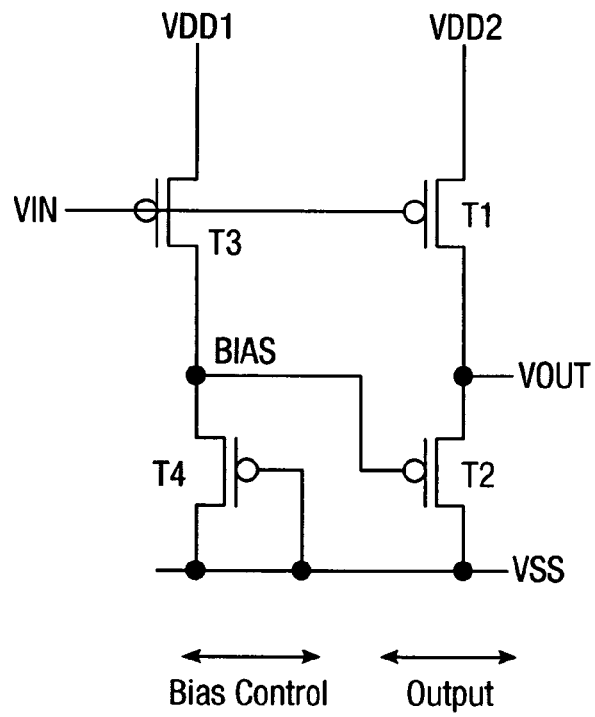
FIG. 5(a) is a circuit diagram of a first embodiment of an OTFT inverter arrangement in accordance with the present invention.
Figure 7A:
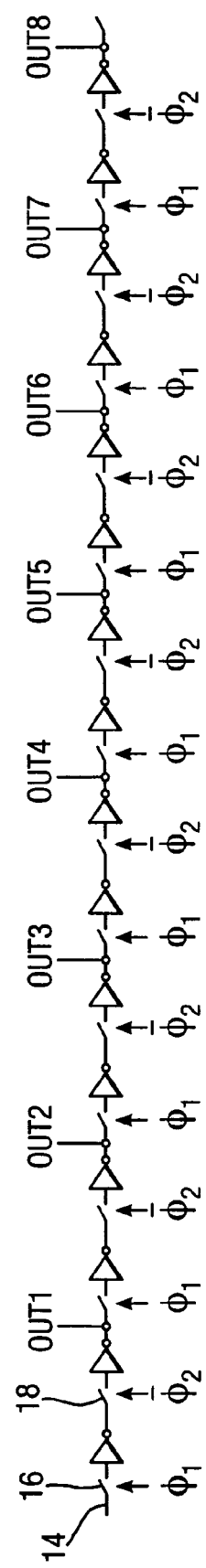
Figure 7B:
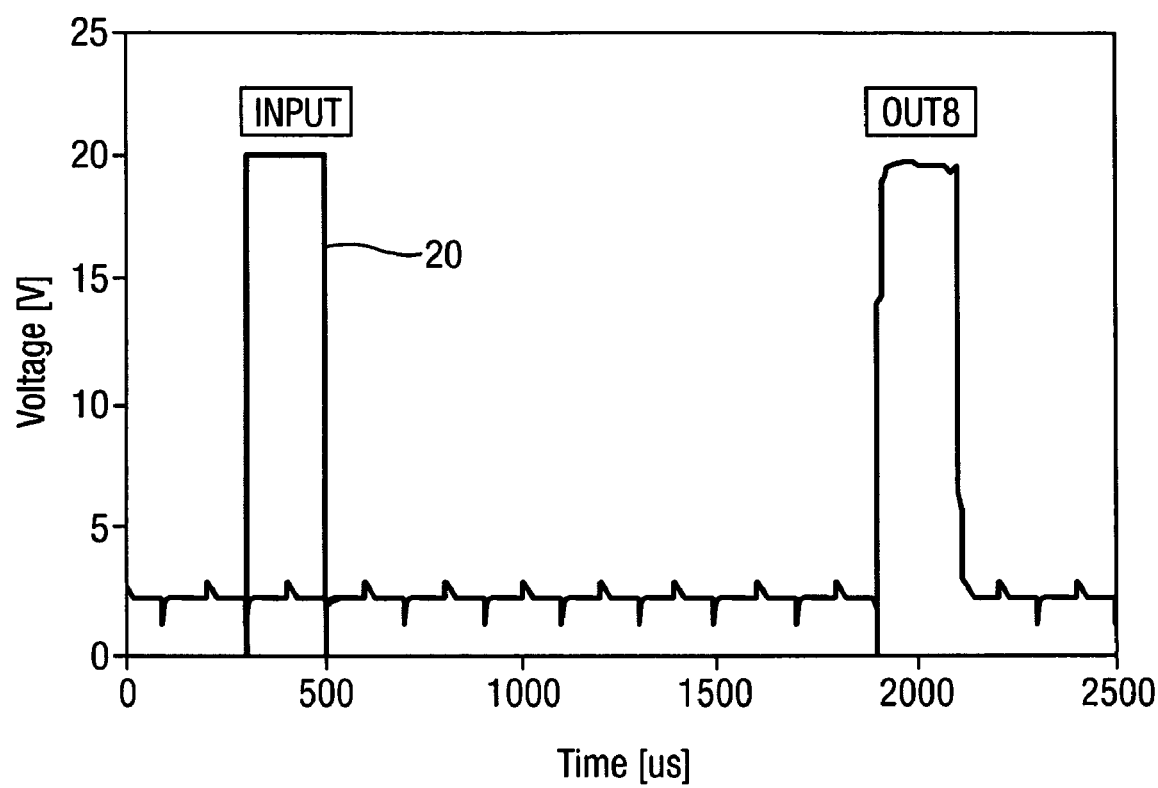
Figure 8:
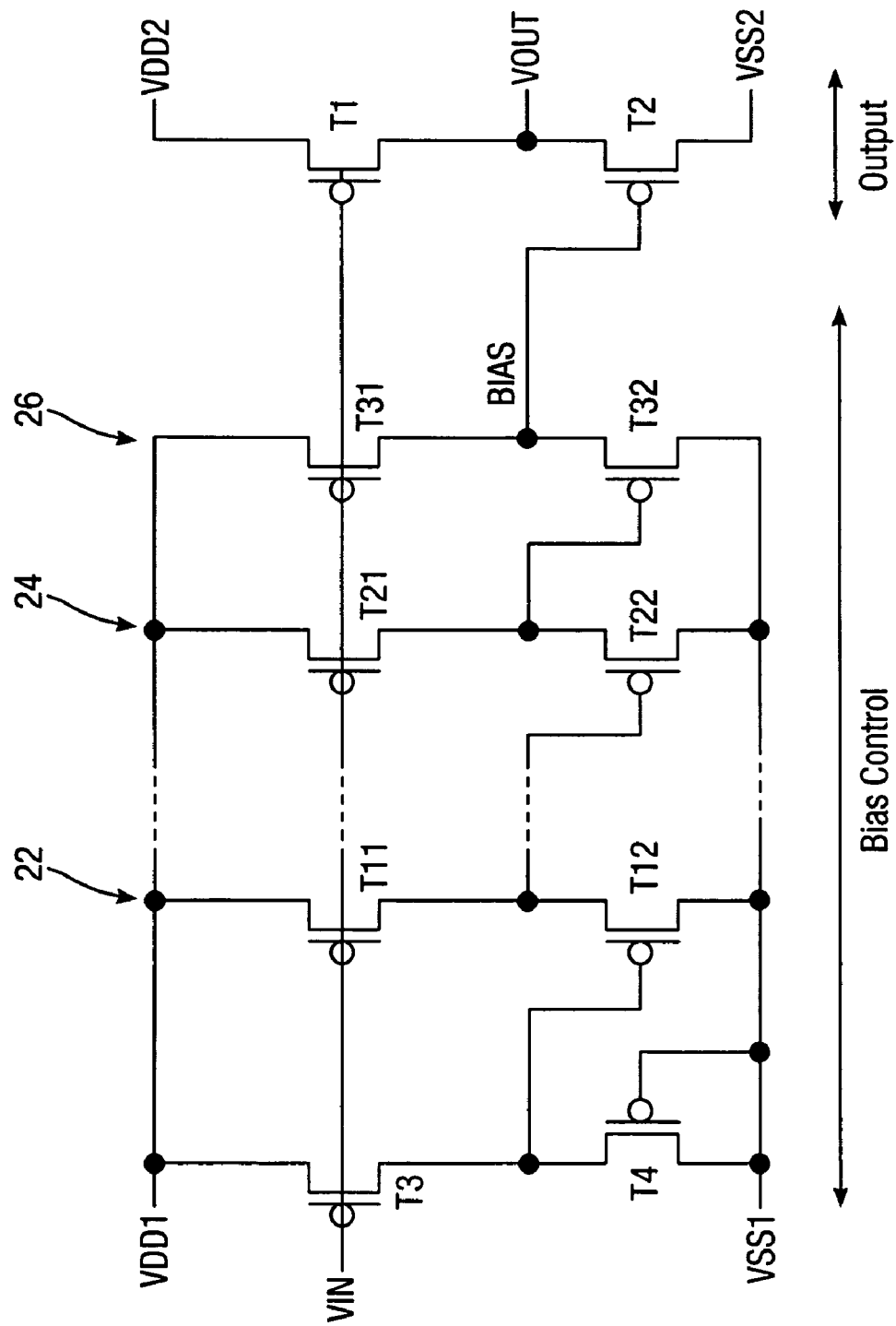
Figure 10:
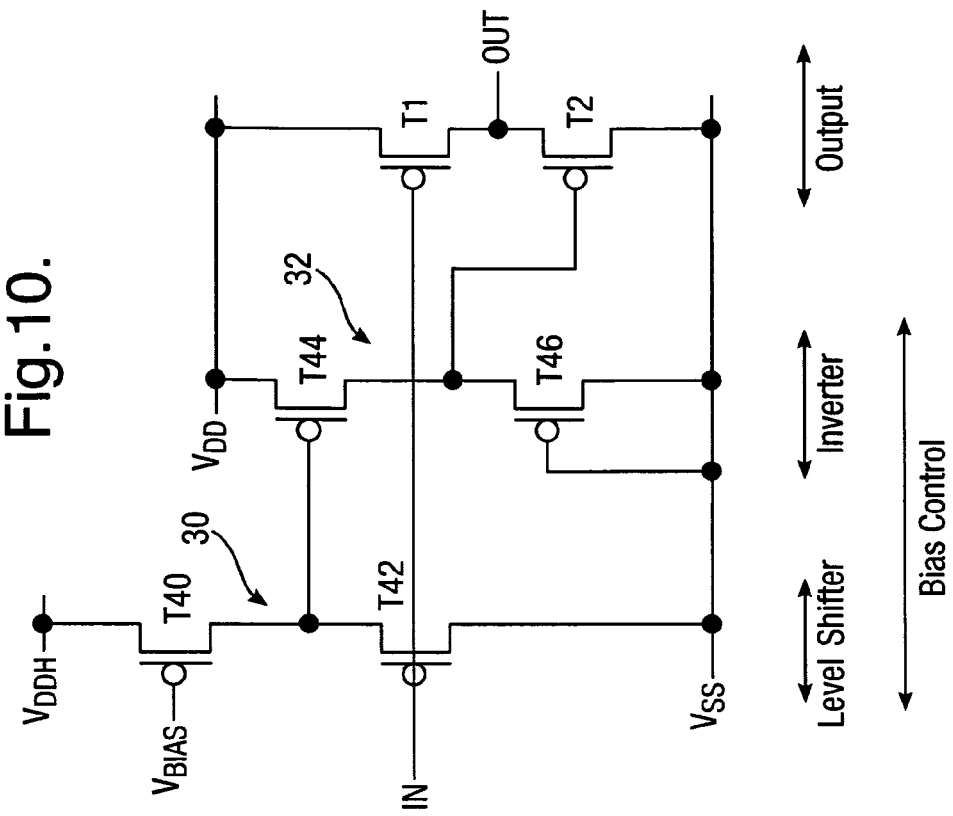
Figure 9:
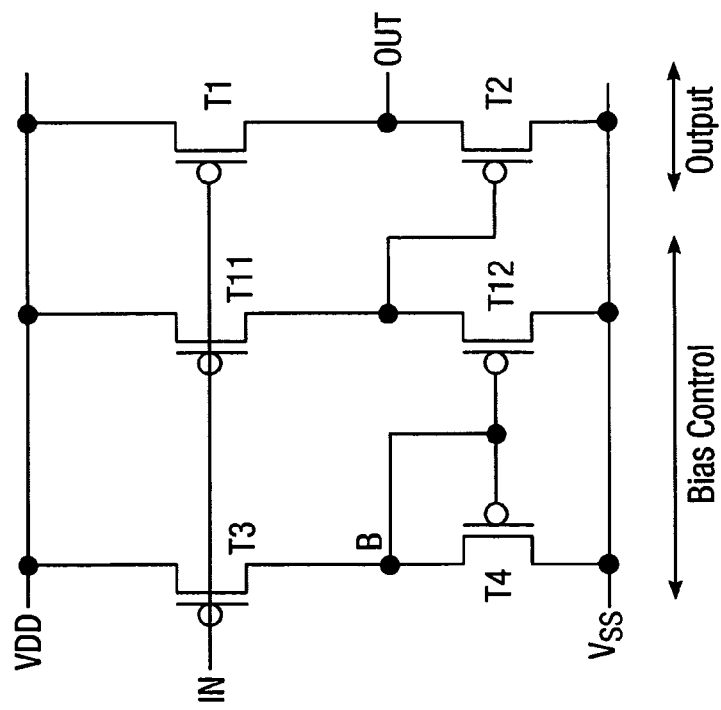
Figure 11:
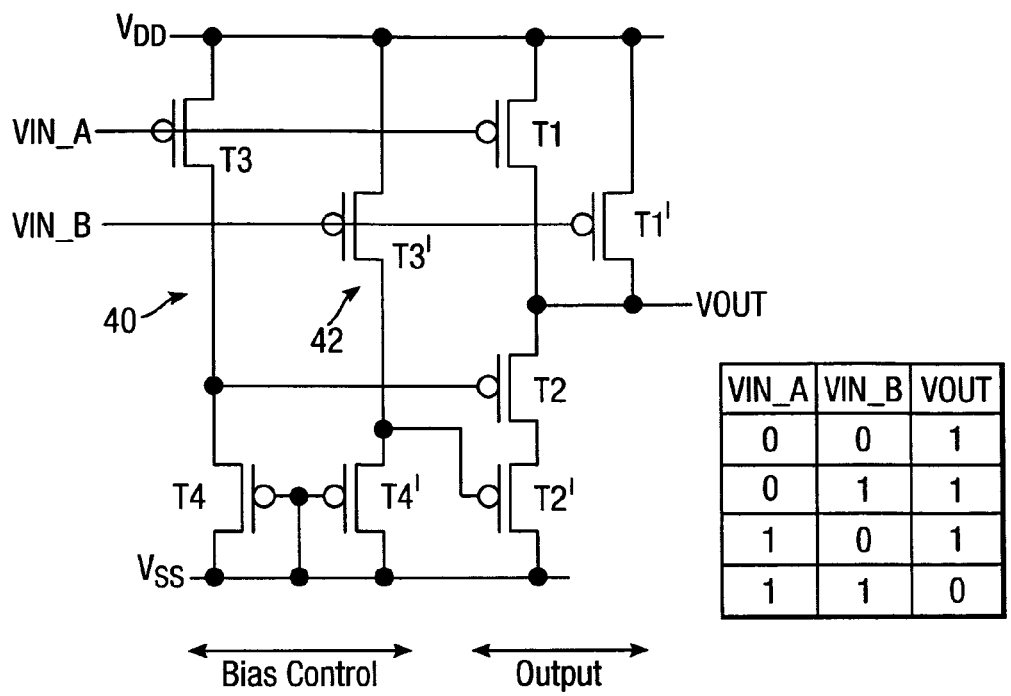
Figure 12:
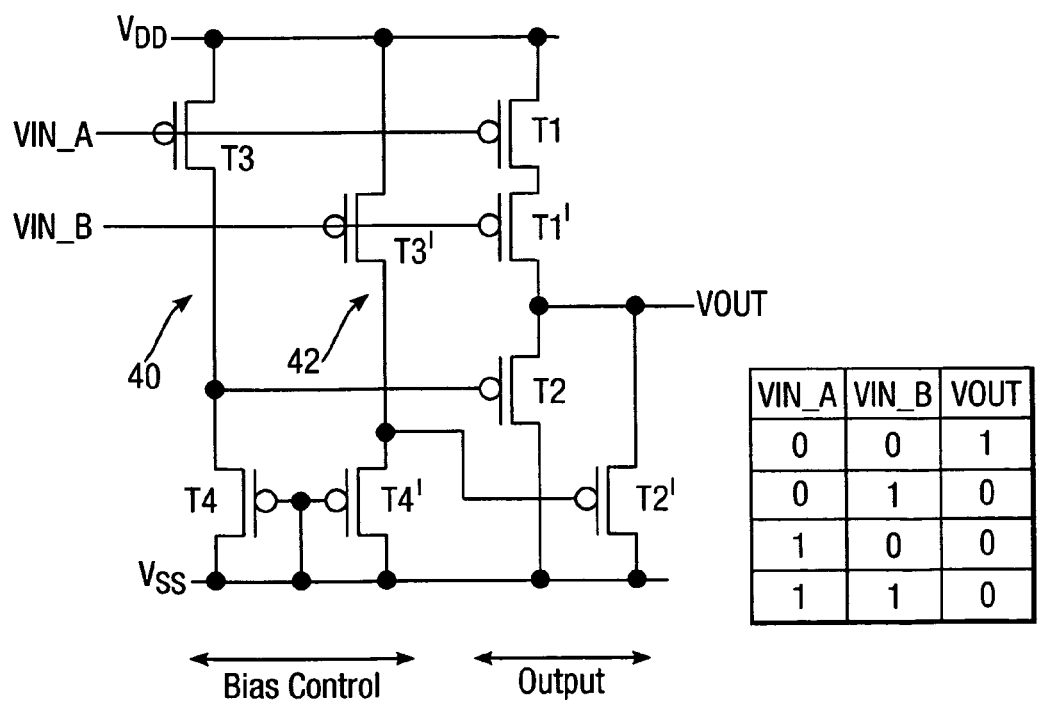

represents a simulated response of the OTFT inverter arrangement shown in FIG. 5(a) configured as a three-stage ring oscillator;

FIGS. 7(a) and 7(b) are, respectively, a circuit diagram of an 8-stage dynamic shift register and a response characteristic of the shift register for a pulse fed into the input;

FIG. 8 is a circuit diagram of a second embodiment of an OTFT inverter arrangement according to the present invention;

FIGS. 9 and 10 are circuit diagrams of third and fourth embodiments, respectively, of an OTFT inverter arrangement according to the present invention, and FIGS. 11 and 12 are circuit diagrams of two different OTFT logic-gate arrangements in accordance with the present invention.

DETAILED DESCRIPTION OF PREFERRED EMBODIMENTS

Referring now to FIG. 4, the basic principle underlying the present invention will be explained.

The arrangement shown in FIG. 4 achieves a wide output voltage swing, which can approach the supply rails. The arrangement centres around an OTFT inverter stage (see FIG. 4(a)) consisting of two organic TFTs T1, T2 connected in series between supply rails $V_{DD}$ and $V_{SS}$ (the diagrams show p-channel devices, but the principle applies equally to n-channel devices also). The node interconnecting these two TFTs forms the output $V_{OUT}$ of the stage, while the gate of transistor T1 forms the input, $V_{IN}$. In order to achieve a wide output-voltage swing, the on/off states of these transistors should be complementary. To make $V_{OUT} \approx V_{DD}$, transistor T1 is turned on and transistor T2 is turned off, while to make $V_{OUT} \approx GND$, transistor T2 is turned on and transistor T1 is turned off. The conditions for turning T1 on and off are straightforward, since $V_{IN}$ is defined in relation to the fixed source voltage, $V_{DD}$. By contrast, the conditions for turning T2 on and off are not so straightforward, since $V_{BIAS}$ is defined in relation to $V_{OUT}$, which varies. This is illustrated in FIG. 4(b). When $V_{IN}$ is low, $V_{OUT}$ moves closer to $V_{DD}$ for a higher $V_{BIAS}$. When $V_{IN}$ is high, on the other hand, $V_{OUT}$ moves closer to $V_{SS}$ for a lower $V_{BIAS}$. The ideal situation is given by the dotted curve, which features a maximum output voltage swing approaching $V_{DD}$ on the one hand and $V_{SS}$ on the other.

Figure 4A:
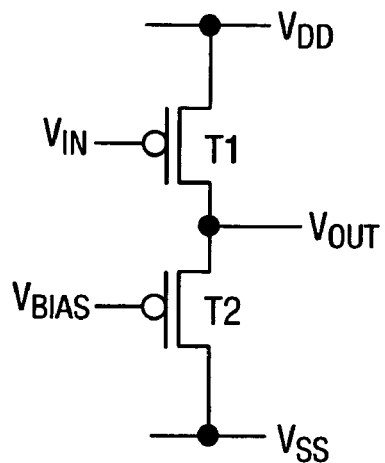
FIGS. 4(a)-4(d) are diagrams illustrating the principle of the OTFT inverter arrangement according to the present invention.
Figure 4B:
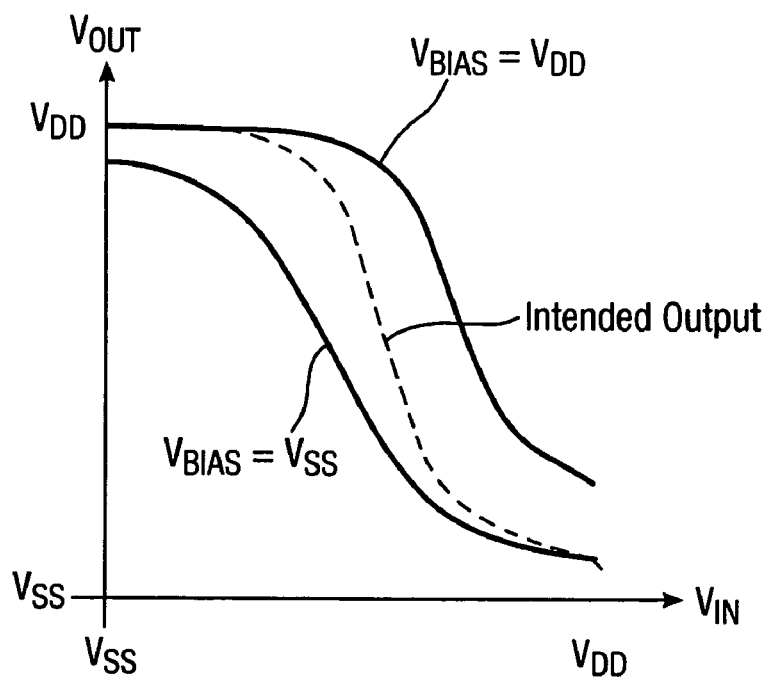
Figure 4C:
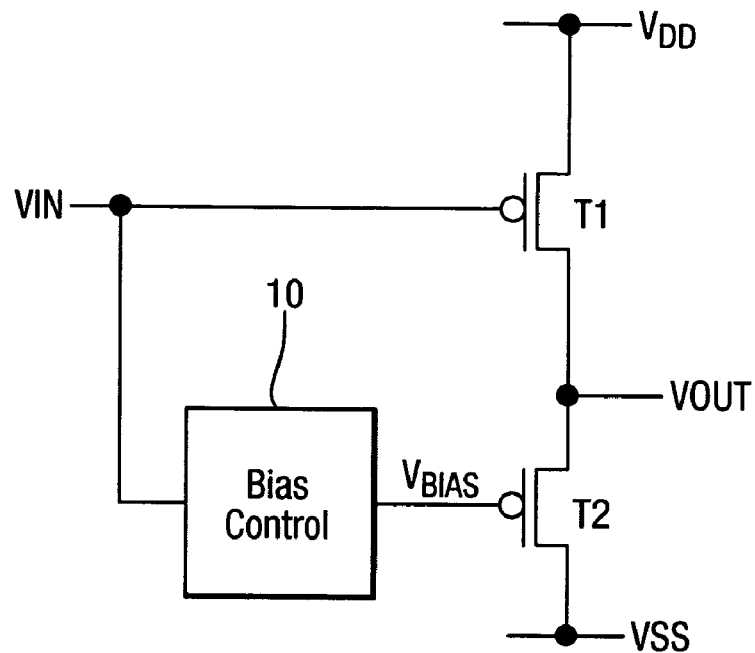
Figure 4D:
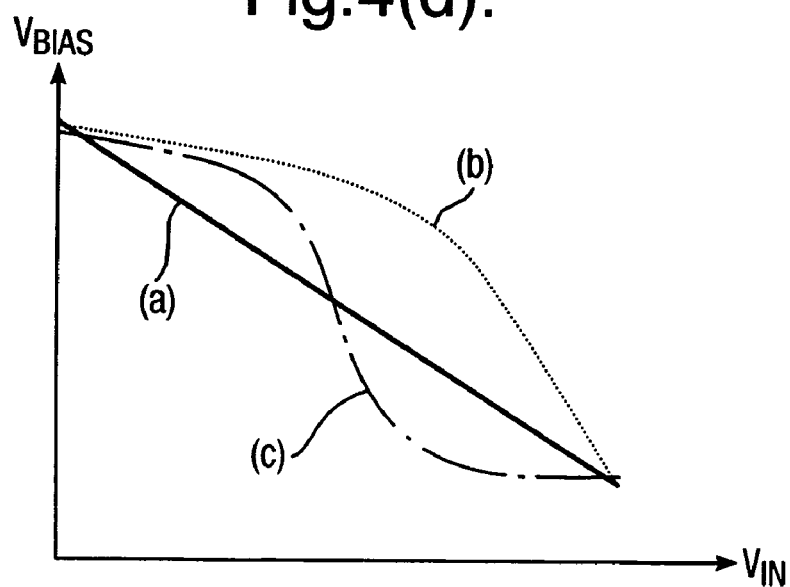

From this it can be seen that $V_{BIAS}$ needs to be dependent on $V_{IN}$. FIG. 4(c) shows such an arrangement in simplified form. A bias control stage 10 is provided, which takes $V_{IN}$ as its input and supplies at its output the voltage $V_{BIAS}$, which varies inversely with $V_{IN}$. Thus stage 10 acts like an inverter and has a transfer characteristic with a negative slope. FIG. 4(d) shows such a transfer characteristic in three alternative forms. Curve (a) is a linear characteristic, while curve (b) slopes gently at first, then has an increasingly negative slope subsequently. Curve (c) starts gently, then has a steeper negative slope, then reverts to a gentler slope. Curve (a) may be found to be sufficient for most applications, though curves (b) and (c) are useful in applications demanding a low DC current consumption. The steep negative slope part of curves (b) and (c) should ideally match the threshold voltage characteristic of transistor T2 to avoid a situation where both T1 and T2 are turned on at the same time.

Figure 1A:
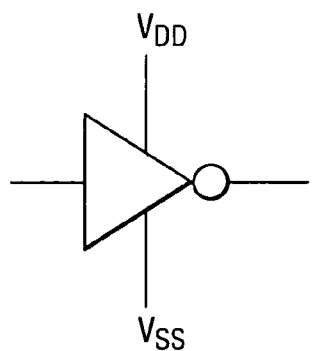
FIG. 1(a) is a general circuit symbol for an inverter and FIGS. 1(b)-1(d) are examples of known inverter arrangements.
Figure 1B:
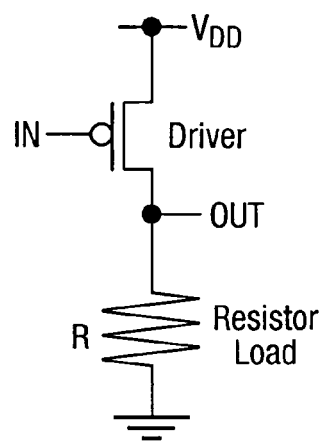
Figure 1C:
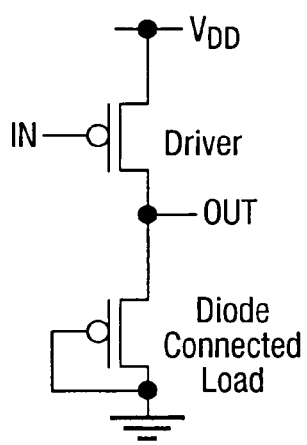
Figure 1D:
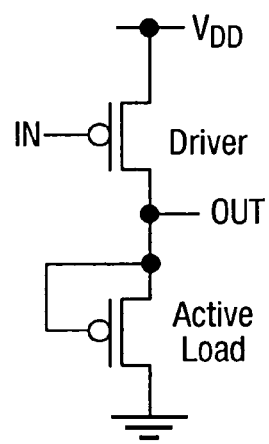
Figure 2A:
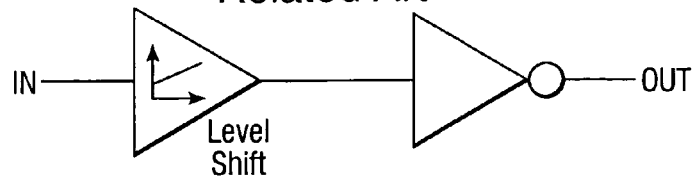
FIG. 2(a) is a general circuit symbol for an inverter fed from a level-shifter stage and FIGS. 2(b) and 2(c) are examples of known inverter arrangements with an upstream level-shifter stage.

It should be noted that the bias control stage 10 is different from the level-shifter described in connection with FIGS. 2 and 3. The slope of the transfer characteristic in a level-shifter is positive (output increases with increasing input), whereas the slope of the transfer characteristic of stage 10 is negative (output decreases with increasing input).

FIG. 5(a) shows a first embodiment of the arrangement of FIG. 4. Transistors T1 and T2 correspond to T1 and T2 of FIG. 4, while the bias control stage 10 of FIG. 4(c) is constituted by a series configuration of further OTFTs T3 and T4 connected between two supply lines. The gates of T1 and T3 are both driven by input signal $V_{IN}$ and the node interconnecting T3 and T4 feeds the gate of T2. Transistor T4 is configured as a diode-connected load for T3. In the example shown, T1 and T3 are fed from different supply lines $V_{DD2}$ and $V_{DD1}$, respectively, though these may be the same supply line, depending on circuit requirements.

Figure 5B:
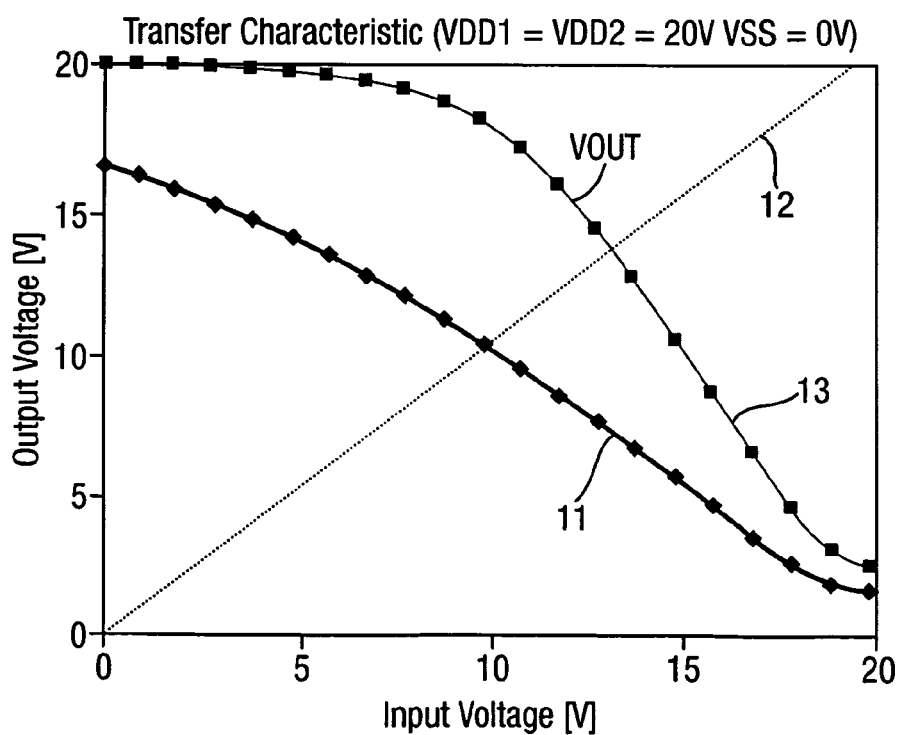
FIG. 5(b) is a graph showing a simulated transfer characteristic for the circuit of FIG. 5(a)

FIG. 5(b) is a graph of the transfer characteristic of a simulation of this arrangement, in which $V_{DD1}$ and $V_{DD2}$ are both at the same potential (20V) and $V_{SS}=0V$. The transistors are all p-channel devices and are of the same size. The curve 11 ($V_{BIAS}$) relates to the output voltage of the bias control stage fed to the gate terminal of T2, whereas curve 13 ($V_{OUT}$) represents the improved inverter function resulting from the inclusion of the bias control stage, T3, T4. As can be seen, not only is the gain (i.e. slope) of the transfer characteristic greatly improved, but the output voltage approaches much nearer to $V_{DD}$ at low $V_{IN}$. This is particularly advantageous where an inverter is used to drive p-channel pixel switching transistors, since in that application the leakage current should be minimized as much as possible.

Figure 6A:
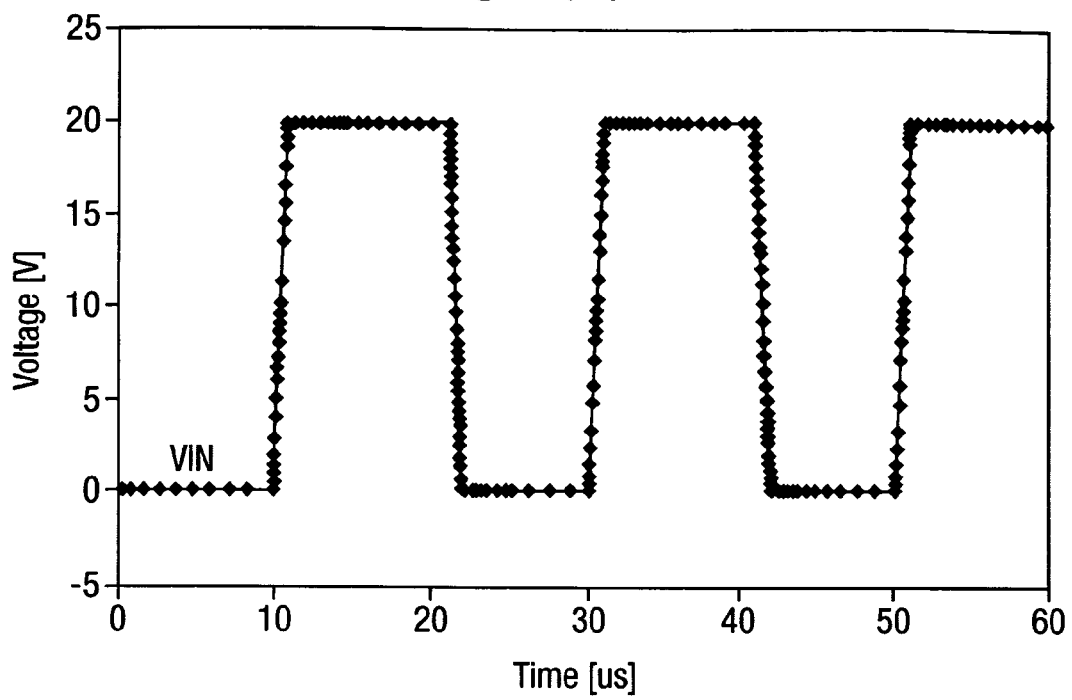
FIGS. 6(a) and 6(b) are graphs showing a simulated transient response of the circuit of FIG. 5(a), while FIG. 6(c)
Figure 6B:
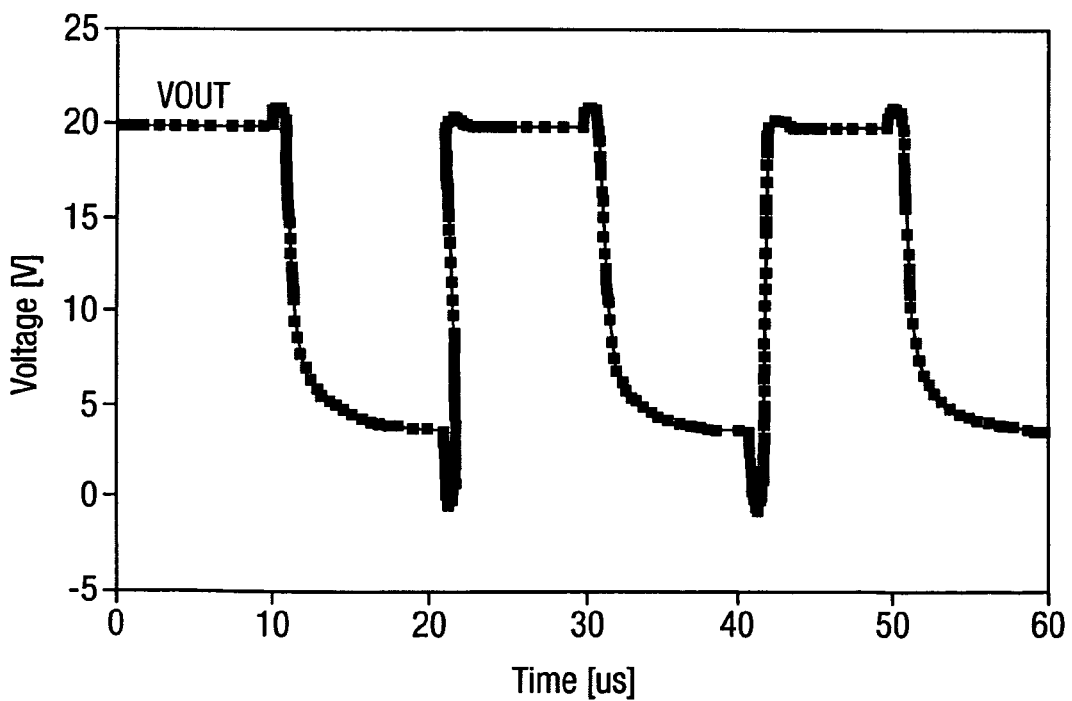

FIGS. 6(a) and 6(b) show the simulated transient response of the FIG. 5 embodiment. The input voltage $V_{IN}$ (see FIG. 6(a)) is an approximately 50 kHz square wave signal of 20V amplitude, while the output voltage $V_{OUT}$ (see FIG. 6(b)) is an inverted version of this, but with a slower response at the falling edge and some overshoots due to an intranodal capacitive-charge-feedthrough effect. FIG. 6(c) shows the output waveform of a three-stage ring oscillator comprising three of the FIG. 5 inverter arrangements connected in series and with the output connected back to the input. The fact that oscillation is sustained means that the gain of each stage is greater than unity. This condition is important for other applications as well. For example, where such inverters are connected in series to form a shift register, if the gain of each inverter stage is less than unity, the logic state "1" or "0" fed into the input of the shift register would not emerge at its output as a distinguishable "1" or "0", but the final stage (and quite possibly some of the earlier stages) would sit at an intermediate level between $V_{SS}$ and $V_{DD}$. This level constitutes the intersection of the curve $V_{BIAS}$ with a unity-gain load line 12 in FIG. 5(b).

Whereas in the conventional inverter care had to be taken to ensure greater than unity gain by appropriate sizing of T1 and T2, and by having sufficient gain in the transistor transfer characteristics, in the present invention it will normally be found that this criterion is satisfied purely by virtue of the inclusion of the bias-control stage. (As already mentioned, the FIG. 6 response curves assume equal-sized transistors and equal supply voltages for the inverter and bias-control stages).

An 8-stage dynamic shift register circuit is shown in FIG. 7(a). In FIG. 7(a) sixteen inverter circuits of, for example, the FIG. 5 embodiment, are connected in series by way of solid-state switches, which are controlled by switching signals $\Phi_1$, $\Phi_2$. $\Phi_1$ and $\Phi_2$ are in antiphase with each other. A voltage on the input terminal 14 is supplied to the input of the first inverter stage by the first switch 16, and this voltage charges up the parasitic input capacitance (not shown) of that stage. Switch 18 is open during this time. Then switch 16 is opened and switch 18 is closed. This passes the input voltage, held on the first parasitic capacitance, to the second stage, where it charges the parasitic capacitance of that stage. The output of the second stage appears as output OUT1. Since all the switches of the first of each pair of inverters is controlled by switching phase $\Phi_1$ and the switches of the second of each pair of inverters is controlled by switching phase $\Phi_2$, the voltages on the input terminal are rippled through the various stages until they appear at the desired outputs.

The simulated performance of this shift register is shown in FIG. 7(b), where the input pulse 20 can be seen to emerge at the output of the shift register (OUT8) 8 clock pulses after the input pulse was fed in. This shift register is suitable for use as a row driver for a display, since the output-voltage swing is large enough to turn the pixel transistors of the display on and off reliably.

A second embodiment of the OTFT inverter arrangement according to the invention is illustrated in FIG. 8. This constitutes a refinement of the first embodiment shown in FIG. 5, since it achieves an even greater output-voltage swing. To achieve this, the bias control stage is augmented by recursive inclusion of further output stages 22, 24 and 26. These further stages comprise respective series-connected OTFT pairs T11 and T12, T21 and T22, T31 and T32 connected between the supply rails $V_{DD}$ and $V_{SS}$. Each of these additional stages achieves a wider output-voltage swing and a greater gain (steeper transfer-function slope) than the one before, so that the output-voltage swing and gain of the original inverter output stage T1, T2 are both significantly enhanced. This expanded bias control arrangement yields a transfer-function characteristic similar to curve (c) shown in FIG. 4(d). The gates of the lower transistor in each stage (T12, T22, T32) are fed to the respective outputs (common nodes) of the previous stage. This applies also to the output stage. This FIG. 8 arrangement illustrates a general case, in which each of the two voltage supply rails are different for the bias-control stage than for the inverter stage. In many cases, however, it will suffice if $V_{DD1}=V_{DD2}$ and $V_{SS1}=V_{SS2}$.

A third embodiment of the present invention is depicted in FIG. 9. The third embodiment corresponds to the second embodiment, in which there is only one additional bias-control stage and transistor T4 is configured as an active load (current source) instead of a diode. In the active-load configuration the gate of T4 is connected to the source of T4 instead of to its drain. It should be noted that an active load can be used for T4 also without the use of any additional bias-control stage. This arrangement would correspond to the arrangement of FIG. 5(a), but with the gate of T4 connected to the source of T4.

Figure 2B:
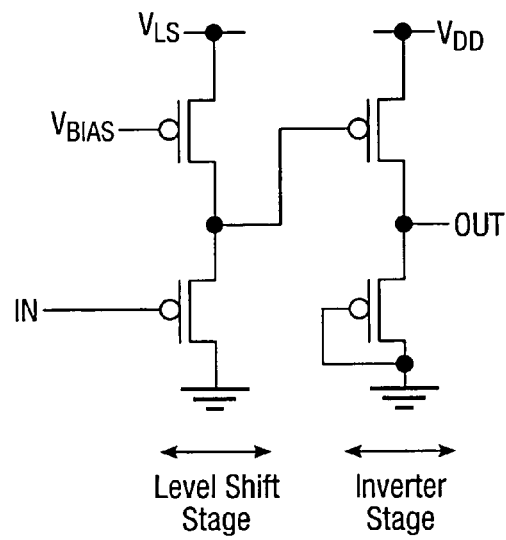
Figure 2C:
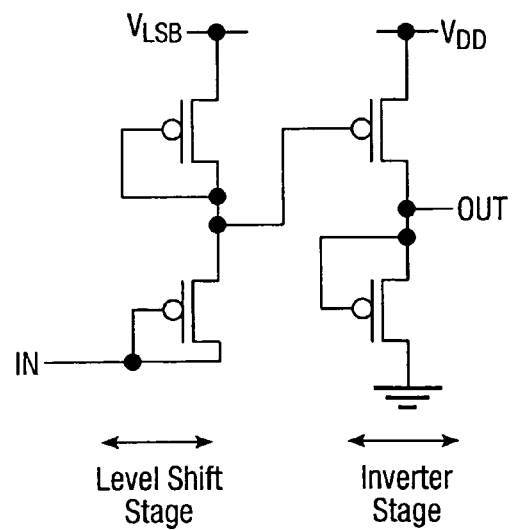
Figure 3A:
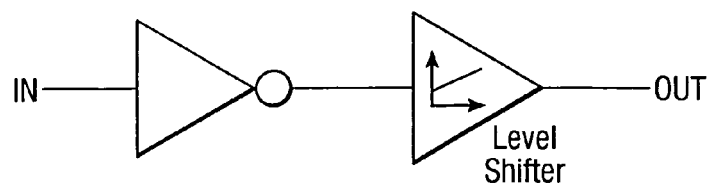
FIG. 3(a) is a general circuit symbol for an inverter feeding a level-shifter stage and FIGS. 3(b) and 3(c) are examples of known inverter arrangements with a downstream level-shifter stage.
Figure 3B:
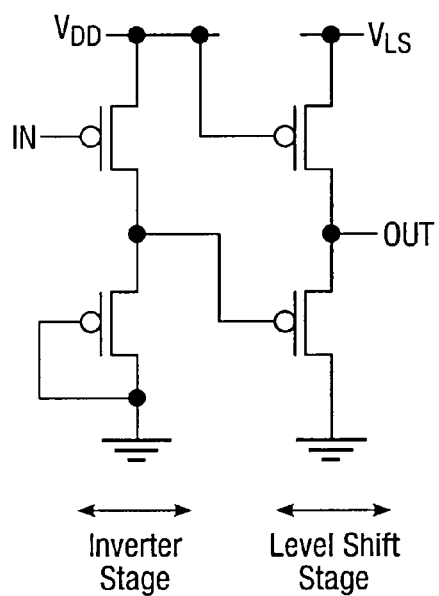
Figure 3C:
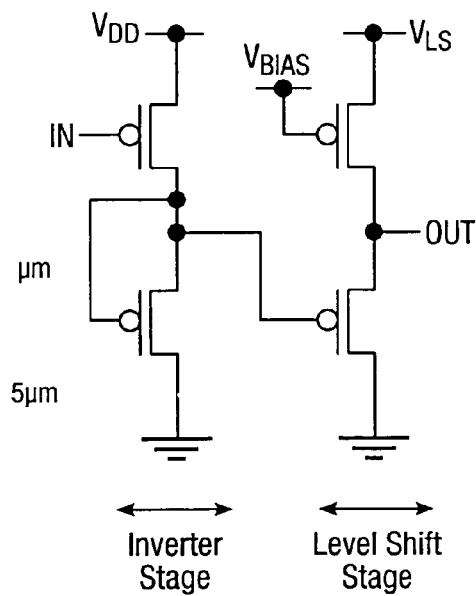

FIG. 10 shows a fourth embodiment, which is based on the Philips design illustrated in FIG. 2(b). Thus in this embodiment the bias-control stage consists of a level-shifter 30 feeding an inverter 32. The input voltage on terminal IN feeds both the gate of the lower transistor in the level-shifter and the gate of T1, while the gate of T2 is fed from the output of the inverter 32. This embodiment also provides a bias-control characteristic similar to that shown in FIG. 4(c).

The OTFT inverter arrangement of the present invention can be used in many different applications. One such application has already been mentioned, namely a shift register, in particular for driving a display. Another possible application is a logic gate. FIGS. 11(a) and 11(b) show two such logic gates.

FIG. 11 is a NAND-gate, which is based on the first embodiment of the present invention shown in FIG. 5. FIG. 11 comprises, in essence, two bias-control stages feeding respective inverter stages. More precisely, a first bias-control stage 40 comprises OTFTs T3 and T4 connected, as described earlier, in series between power-supply rails $V_{DD}$ and $V_{SS}$, and a second bias-control stage 42 comprises OTFTs T3' and T4' similarly connected. Transistors T4 and T4' are, in the illustrated example, diode-connected devices, though they could alternatively be active loads, as described earlier. The two inverter stages consist of a first inverter stage T1, T2 and a second inverter stage T1', T2'. Transistors T1 and T1' are connected in parallel, while transistors T2 and T2' are connected in series. The gates of T1 and T3 are driven in common by a first input $V_{IN\_A}$, while the gates of T1' and T3' are driven in common by a second input $V_{IN\_B}$. The gates of T2 and T2' are fed from the sources of T4 and T4', respectively, that is, by the outputs of the respective bias-control stages.

The various logic states of the arrangement are summarized in the table accompanying the diagram, and can be seen to correspond to a NAND function.

In a manner analogous to the FIG. 8 embodiment, the NAND-gate arrangement could, if desired, be provided with one or more additional bias-control stages for each of the two existing stages 40, 42. The gates of the upper transistor of each additional bias-control stage would be connected in common with the gates of the respective upper transistors, T3 and T3', of the respective existing bias-control stage 40, 42 and the sources of the lower transistor of each additional bias-control stage would be connected to the gate of the lower transistor of the following additional bias-control stage. The gate of the lower transistor of the first additional bias-control stage would be connected to the output of the existing bias-control stage 40/42, while the output of the final additional bias-control stage would be connected to the gate of T2/T2'.

An OTFT NOR-gate arrangement is shown in FIG. 12. As with the NAND-gate arrangement, this arrangement has separate bias-control stages 40, 42, but the inverter stages are differently arranged. Instead of T1 and T1' being connected in parallel and T2 and T2' being connected in series, the situation is reversed. This gives rise to the NOR function shown in the accompanying table, which shows the various logic states for the quantities $V_{IN\_A}$, $V_{IN\_B}$ and $V_{OUT}$. As with the NAND arrangement, additional bias-control stages may be included, if desired, in order to improve the gain and output-voltage swing of the final inverter stages.

Although the shift-register arrangement shown in FIG. 7(a) has been described as being based on the inverter arrangement illustrated in FIG. 5, it may be based instead on one of the other embodiments, e.g. FIG. 8, 9 or 10.

It has already been mentioned in connection with FIGS. 5 and 8 that the two voltage rails $V_{DD}$ supplying the inverter stage and the bias-control stage may be the same or different, and this also applies to the other embodiments, e.g. the FIGS. 9 and 10 embodiments. Whether separate $V_{DD}$ rails are used will depend largely on the threshold voltages of the MOS transistors. Thus, by increasing $V_{DD}$ in the bias control stage, the gain (transfer characteristic) of the bias-control stage may improve (i.e. move closer to curves (b) and (c) in FIG. 4(d)) in some cases. This is because increasing $V_{DD}$ by making $V_{DD1}>V_{DD2}$ ensures that T2 is completely turned off when T1 is turned-on. A similar situation arises in the case of $V_{SS}$ also. Thus, decreasing $V_{SS}$ by making $V_{SS1}<V_{SS2}$ ensures that T2 is more fully turned on when $V_{IN}$ is high. As already mentioned, this applies not only to the embodiment of FIG. 8, but to the other embodiments also.

What is claimed is:

1. An organic transistor inverter arrangement, comprising:
   a first supply terminal;
   a second supply terminal;
   a first organic transistor having a first gate, the first organic transistor electrically connected to the first supply terminal;

a second organic transistor having a second gate, the second organic transistor electrically connected to the second supply terminal, the second organic transistor electrically connected to the first organic transistor, the first and second organic transistors being configured to work as an inverter stage;
a third supply terminal;
a fourth supply terminal;
a third organic transistor electrically connected to the third supply terminal;
a fourth organic transistor electrically connected to the fourth supply terminal, the third organic transistor electrically connected to the fourth organic transistor;
a fifth organic transistor electrically connected to the third supply terminal;
a sixth organic transistor electrically connected to the fourth supply terminal, the fifth organic transistor electrically connected to the sixth organic transistor, the fifth and sixth organic transistors being controlled by the third and fourth organic transistors and feeding the first and second gates, respectively, the third, fourth, fifth and six organic transistors being configured to work as a bias-control stage such that, when an input voltage on the first gate rises, a voltage on the second gate falls, and vice-versa;
an input terminal electrically connected to the first gate; and
an output terminal connected to a node interconnecting the first and second organic transistors.

2. The organic transistor inverter arrangement according to claim 1,
the third, fourth, fifth and sixth organic transistors having third, fourth, fifth and sixth gates, respectively, the third gate and the fifth gate being connected to each other and to the first gate;
a node interconnecting the third and fourth organic transistors being connected to the sixth gate, and
a node interconnecting the fifth and sixth organic transistors being connected to the second gate.

3. The organic transistor inverter arrangement according to claim 2,
the fourth organic transistor being configured as a diode-connected load for the third organic transistor.

4. The organic transistor inverter arrangement according to claim 2,
the fourth organic transistor being configured as an active load for the third organic transistor.

5. The organic transistor inverter arrangement according to claim 2,
the bias-control stage including at least one further series arrangement of organic transistors connected between the third and fourth supply terminals, the at least one further series arrangement being disposed, referred to the signal flow, between the series arrangement including the fifth and sixth organic transistors and the inverter stage.

6. The organic transistor inverter arrangement according to claim 5,
the first and third organic transistors being connected to the first and third supply terminals, respectively, and the second and fourth organic transistors being connected to the second and fourth supply terminals, respectively;
the input terminal being connected to the first and third gates and to a first group of the gates of those organic transistors of the further series arrangements, which are connected to the third supply terminal;
a second group of the gates of those transistors of the further series arrangements, which are connected to the fourth supply terminal, being connected to the respective nodes of the preceding series arrangements, which interconnect the organic transistors of those series arrangements, and
the node interconnecting the organic transistors of the further series arrangement nearest the inverter stage being connected to the second gate.

7. An organic transistor inverter arrangement comprising:
a first supply terminal;
a second supply terminal;
a first organic transistor having a first gate, the first organic transistor electrically connected to the first supply terminal;
a second organic transistor having a second gate, the second organic transistor electrically connected to the second supply terminal, the second organic transistor electrically connected to the first organic transistor, the first and second organic transistors being configured to work as an inverter stage;
a third supply terminal;
a third organic transistor having a third gate, the third organic transistor being electrically connected to the first supply terminal;
a fourth organic transistor electrically connected to the second supply terminal, the third organic transistor electrically connected to the fourth organic transistor, the second gate being electrically connected to a node interconnecting the third and fourth organic transistors;
a fifth organic transistor having a fifth gate, the fifth organic transistor being electrically connected to the third supply terminal, the fifth gate being supplied with a bias voltage;
a sixth organic transistor having a sixth gate, the sixth organic transistor electrically connected to the second supply terminal, the fifth organic transistor electrically connected to the sixth organic transistor, the third gate being connected to a node interconnecting the fifth and sixth organic transistors, the third, fourth, fifth and six organic transistors being configured to work as a bias-control stage such that, when an input voltage on the first gate rises, a voltage on the second gate falls, and vice-versa;
an input terminal electrically connected to the first and sixth gates, the first gate being electrically connected to the sixth gate; and
an output terminal connected to a node interconnecting the first and second organic transistors.

8. The organic transistor arrangement according to claim 7,
the fourth organic transistor being configured as a diode-connected load for the third organic transistor.

9. The organic transistor inverter arrangement according to claim 7,
the fourth organic transistor being configured as an active load for the third organic transistor.

* * * * *